United States Patent [19]

Ishihara et al.

[11] 4,307,172

[45] Dec. 22, 1981

[54] IMAGING LIGHT-SENSITIVE MATERIAL WITH ETCHABLE OPAQUE POLYAMIDE UNDERLAYER AND LIGHT-SENSITIVE RESIST OVERLAYER

[75] Inventors: Tetsuo Ishihara, Itami; Keizi Kubo, Amagasaki, both of Japan

[73] Assignee: Daicel Chemical Industries, Ltd., Osaka, Japan

[21] Appl. No.: 145,281

[22] Filed: Apr. 30, 1980

[30] Foreign Application Priority Data

May 11, 1979 [JP] Japan .......................... 54/63514[U]

[51] Int. Cl.$^3$ .......................... G03C 1/80; G03C 1/52
[52] U.S. Cl. .......................... 430/160; 430/155; 430/166; 430/167; 430/145; 430/271; 430/294; 430/323
[58] Field of Search .............. 430/155, 160, 271, 166, 430/167, 253, 254, 294, 323, 145

[56] References Cited

U.S. PATENT DOCUMENTS

| | | | |
|---|---|---|---|
| 3,549,373 | 12/1970 | Homada et al. | 430/155 |
| 3,645,732 | 2/1972 | Jones | 430/307 |
| 3,721,557 | 3/1973 | Inoue | 430/257 |
| 3,778,272 | 12/1973 | Hepher | 430/262 |
| 4,041,204 | 8/1977 | Hepher et al. | 430/253 |
| 4,088,492 | 5/1978 | Pope et al. | 430/160 |
| 4,207,106 | 6/1980 | Odawara et al. | 430/193 |
| 4,232,105 | 11/1980 | Shirohara et al. | 430/155 |
| 4,268,601 | 5/1981 | Namiki et al. | 430/294 |

*Primary Examiner*—Charles L. Bowers, Jr.
*Attorney, Agent, or Firm*—Blanchard, Flynn, Thiel, Boutell & Tanis

[57] ABSTRACT

Disclosed is an imaging light-sensitive material which comprises a transparent substrate, [I] a polyamide layer containing an alcohol-soluble polyamide as the major component and having a thickness of from 2 to 11 microns and [II] a light-sensitive layer having a thickness of from 0.5 to 5 microns.

7 Claims, 1 Drawing Figure

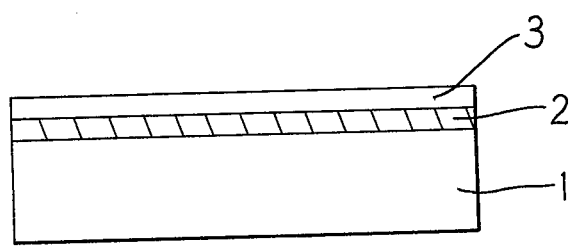

IMAGING LIGHT-SENSITIVE MATERIAL WITH ETCHABLE OPAQUE POLYAMIDE UNDERLAYER AND LIGHT-SENSITIVE RESIST OVERLAYER

BACKGROUND OF THE INVENTION (1) Field of the Invention:

The present invention relates to an imaging light-sensitive material which can be widely used for graphic design, for formation of printing masters and for preparation of printing plates. More particularly, the present invention relates to an imaging material having a three-layer structure including a transparent substrate, a polyamide layer containing an alcohol-soluble polyamide and a light-sensitive photoresist layer.

(2) Description of the Prior Art:

An imaging material having a three-layer structure as described above is well-known as disclosed in Japanese Patent Application Laid-Open Specification No. 116303/77. On such imaging material, an image is formed by exposure to light, and then developing and etching are conducted in sequence. As regards means for forming an image according to these procedures, we previously proposed in Japanese Patent Applications Nos. 35210/79 and 27522/79 an improved method in which the developing and etching are accomplished simultaneously with one treating solution.

These conventional imaging methods, however, involve problems to be solved on actual operations, for example, insufficient latitude of the etching operation, insufficient sharpness of the formed image (insufficient latitude of the developing) and insufficient mechanical strength of the formed image.

We made researches with a view to solving these problems from various viewpoints, for example, on the treating solution for forming images in the above-mentioned previously proposed method. As the result, we proposed, for example, a light-sensitive photoresist composition as disclosed in Japanese Patent Applications Nos. 31579/79, 38092/79, 38093/79 and 36370/79.

Throughout our researches, it was found that in the imaging material of the above-mentioned type, the solution of the foregoing problems is greatly influenced by the thicknesses of the light-sensitive photoresist layer and the polyamide layer. More specifically, it was found that an imaging light-sensitive material having a three layer structure including a transparent substrate, [I] a polyamide layer containing an alcohol-soluble polyamide as the major component and having a thickness of from 2 to 11 microns and [II] a light-sensitive photoresist layer having a thickness of from 0.5 to 5 microns is well-balanced in the developing property, etching property, mechanical strength of the formed image and actinic opacity and is very excellent as the imaging material. We have now completed the present invention based on this finding.

SUMMARY OF THE INVENTION

In accordance with the fundamental aspect of the present invention, there is provided an imaging light-sensitive material comprising the following two layers [I] and [II] formed on a transparent substrate:

[I] a polyamide layer comprising an alcohol-soluble polyamide as the major component and having a thickness of from 2 to 11 microns, and

[II] a light-sensitive photoresist layer having a thickness of from 0.5 to 5 microns overlaying the polyamide layer.

BRIEF DESCRIPTION OF THE DRAWING

The drawing is a sectional view illustrating the section of an embodiment of the imaging light-sensitive material according to the present invention, in which reference numerals 1, 2 and 3 represent a transparent substrate, a polyamide layer and a light-sensitive photoresist layer, respectively.

DETAILED DESCRIPTIONS OF THE PREFERRED EMBODIMENTS

In the present invention, as the transparent substrate, there can be used, for example, sheets and films of polymers such as polyethylene terephthalate, polypropylene, polystyrene, polycarbonate and cellulose acetate, and glass sheets.

In the present invention, the alcohol-soluble polyamide layer is formed as a layer acting as an actinically opaque layer. Known alcohol-soluble polyamides, for example, copolymer nylons such as nylon 6/66, nylon 6/66/610, nylon 6/66/610/612 and nylon 6/66/12, and N-alkoxyalkyl and other derivatives of polyamides, may be used for formation of the alcohol-soluble polyamide layer. In the N-alkoxyalkyl derivatives of polyamides, each of the alkoxy and alkyl groups has preferably 1 to 8 carbon atoms, and the degree of alkoxyalkylation is ordinarily 10 to 40% and preferably 15 to 35%. If the degree of alkoxyalkylation is lower than 10%, the solution of the N-alkoxyalkyl polyamide is poor in the stability and gelation is readily caused. If the degree of alkoxyalkylation exceeds 40%, the alkoxyalkyl polyamide is very soft and tacky and the strength of the resulting coating film is low, and therefore, the use of such alkoxyalkyl polyamide is not preferred.

These polyamides may be used in the form of a mixture of two or more of them, and a mixture of a copolymer nylon and an N-alkoxyalkyl polyamide is preferred. In this mixture, the content of the N-alkoxyalkyl polyamide is at least 40% by weight and lower than 100% by weight, and from the viewpoints of the film strength, sealing characteristics, etching property and blocking property in the manufacturing process, it is preferred that the content of the N-alkoxyalkyl polyamide be 50 to 90% by weight.

Furthermore, the use of a mixture of the above-mentioned N-alkoxyalkyl polyamide with a cellulose ester derivative such as cellulose nitrate, cellulose acetate propionate, cellulose acetate butyrate or cellulose propionate is preferred. In this mixture, the content of the N-alkoxyalkyl polyamide is adjusted within the range of from 80 to 99.9% by weight.

A dye or pigment may be added to the polyamide layer. An oil-soluble dye is preferred. As such dye or pigment, there can be mentioned, for example, Neozapon Red GE (manufactured by BASF), Varifast Red #3306 (manufactured by Orient Kagaku), Spilon Orange GRM (manufactured by Hodogaya Kagaku), WDR-3 and Lithol Toner Light (manufactured by Holland Color & Chemical). The dye or pigment is preferably added in an amount of 15 to 30% by weight. The polyamide layer also acts as the actinically opaque layer. When it is desired to attain a sufficient actinic opacity, the content of the dye or pigment is relatively increased.

Furthermore, it is preferred to use a dye or pigment having a high compatibility with the alcohol-soluble polyamide.

In the present invention, it is indispensable that the thickness of the polyamide layer should be from 2 to 11 microns, preferably 4 to 10 microns. From the viewpoints of the etching speed and the sharpness of the image, a smaller thickness is preferred for the polyamide layer, but if the thickness of the polamide layer is smaller than 2 microns, peeling of imaged portion from the substrate is difficult and in order to obtain a sufficient actinic opacity, it is necessary to use the dye or pigment in a large amount, resulting in reduction of the adhesion. From the viewpoints of the mechanical strength of the formed image and actinic opacity, a larger thickness is preferred for the polyamide layer, but if the thickness exceeds 11 microns, a long time is required for the etching treatment and the sharpness of the image is degraded, and no good results can be obtained.

In addition to the above-mentioned dye or pigment, there may be added various additives to the polyamide layer. For example, such additives as plasticizers, antioxidants, antistatic agents, ultraviolet absorbents, thermal stabilizers and organic and inorganic lubricants may be added in small amounts according to need.

The light-sensitive photoresist layer contains a known compound such as an O-quinone diazide compound, an azide compound or a diazo compound, or a photosensitive composition as previously proposed by us in the above-mentioned Japanese Patent Publications Nos. 31579/79, 38029/79 and 36370/79 may be used for formation of the light-sensitive photoresist layer. From the viewpoint of the developing property, a smaller thickness is preferred for the light-sensitive photoresist layer, but from the viewpoint of the film strength and easiness in the coating operation, it is preferred that the thickness of the light-sensitive photoresist layer be from 0.5 to 5 microns. The light-sensitive photoresist layer will now be described in detail.

The light-sensitive photoresist layer is formed from a light-sensitive photoresist composition. As the light-sensitive agent that can be used for the light-sensitive photoresist composition, there can be mentioned, for example, azide compounds, o-quinone diazide compounds, and organic solvent-soluble diazo compounds, disclosed in Light-Sensitive Systems, pages 321–352, written by Jaromir Kosar and published by John Wiley & Sons Incorporated. Typical compounds will now be described, though applicable compounds are not limited to these compounds.

AZIDE COMPOUNDS 4,4'-Diazidodiphenylamine, 3,3'-dimethoxy-4,4'-diazidodiphenyl, 4,4'-diazidostilbene, 4,4'-diazidochalcone, 2,6-di-(4'-azidobenzal)cyclohexanone and 1-azidopyrene.

O-QUINONE DIAZIDE COMPOUNDS

Esters of 1,2-benzoquinone-diazido-(2)-4-sulfonic acid, 1,2-naphthoquinone-diazido-(2)-4-sulfonic acid and 1,2-naphthoquinone-diazido-(2)-5-sulfonic acid with phenol-formaldehyde resins, and esters of 1,2-benzoquinone-diazido-(2)-4-sulfonic acid, 1,2-naphthoquinone-diazido-(2)-4-sulfonic acid and 1,2-naphthoquinone-diazido-(2)-5-sulfonic acid with polyhydroxyphenol and 2,3,4-trihydroxybenzophenone.

DIAZO COMPOUNDS

Reaction products of p-diazodiphenylamine/formaldehyde condensates with p-toluene-sulfonic acid and 2-hydroxy-4-methoxybenzophenone-5-sulfonic acid.

These compounds may be used singly, but in order to reinforce the mechanical strength of the formed image and improve the film-forming property, it is preferred that these compounds be used in the form of mixtures with alkali-soluble phenol-formaldehyde resins, styrene-maleic anhydride resins and other resins.

The present invention will now be in detail with reference to the following Examples that by no means limit the scope of the invention.

EXAMPLES 1 THROUGH 3 AND COMPARATIVE EXAMPLES 1 AND 2

The following coating composition was coated, in a thickness indicated in Table, on a biaxially oriented polyethylene terephthalate (PET) film to form a polyamide layer.

| Coating composition: | |
| --- | --- |
| N-Methoxymethylated nylon 6 | 7 parts by weight |
| Alcohol-soluble 6/66/610 copolymer nylon | 3 parts by weight |
| Dye (Neozapon Red GE/Neozapon Orange RE = 3/1 | variable (changed according to the thickness of the polyamide layer) |
| Methanol | 70 parts by weight |
| Toluene | 20 parts by weight |

Then, a positive light-sensitive coating solution having a compostion indicated below was prepared, filtered and coated in a thickness of about $3\mu$, on the resulting polyamide layer to form a light-sensitive photoresist layer.

| Positive light-sensitive coating solution: | |
| --- | --- |
| Alkali-souble cresol-novolak resin | 10 parts by weight |
| 1,2-Naphthoquinone-diazido-(2)-5-sulfonyl chloride/alkali-soluble phenol-novolak resin condensate | 5 parts by weight |
| Methylethyl ketone/ethyl cellosolve acetate/butyl acetate (6/3/1) | 100 parts by weight |

The resulting imaging light-sensitive material was imagewise exposed to a 2 KW super-high-pressure mercury lamp at a distance of 1 meter for 2 minutes through a negative film. The exposed light-sensitive material was developed by treating with a 4% aqueous solution of trisodiumphosphate in a vat at 25° C. and the exposed areas were removed from the light-sensitive photoresist layer. After the developing, the light-sensitive material was rinsed with running water for 30 seconds and was then dried. The developed imaging light-sensitive material comprising resist-free areas were lightly rubbed with an absorbent cotton impregnated with an etching solution consisting of an aqueous solution containing 20% by weight of sodium toluene-sulfonate. As a result of the above processing, the polyamide layer was completely removed away from the PET film in the open image areas of the photoresist layer. The latitude of the photoresist layer to the developing, the latitude of the polyamide layer to the etching and the quality of the obtained image bearing material were evaluated to obtain results shown in Table 1.

for comparison, a comparative imaging light-sensitive material including a polyamide layer having a thickness outside the range specified in the present invention was prepared and evaluated in the same manner as described above. The obtained results are shown in Table 1.

TABLE 1

| Sample | Polyamide Layer Thickness Photoresist Layer | ness (μ) | amount weight of dye | Evaluation of Photoresist Layer coating property | develop- ing speed | tion of pinholes | etching speed | Evaluation of adhesion to PET | film strength | side- etching |
|---|---|---|---|---|---|---|---|---|---|---|
| Example 1 | 3-4 | 4-5 | 4 | good | good | not | good | good | good | small |
| Example 2 | 3-4 | 5-6 | 3.5 | good | good | not | good | good | good | small |
| Example 3 | 3-4 | 8-9 | 2 | good | good | not | good | good | good | small |
| Comparative Example 1 | 3-4 | 1-2 | 10 | good | good | not | too high | low | low | large |
| Comparative Example 2 | 3- | 12-13 | 15 | good | good | not | too low | good | good | large |

As will readily be understood from the results shown in Table 1, imaging materials prepared in Examples 1 through 3 were free of defects, and it was found that image bearing materials formed from these materials were valuable as patterns for preparation of printing plates.

EXAMPLES 4 AND 5 AND COMPARATIVE EXAMPLES 3 AND 4

A polyamide layer was formed in the same manner as described in Example 3 except that the dye was not added, and the same positive photoresist composition as used in Examples 1 to 3 was coated in a thickness indicated in Table 2 on the polyamide layer. The obtained imaging material was developed, etched and evaluated in the same manner as described in Examples 1 to 3 to obtain results shown in Table 2.

TABLE 2

| Sample | Thickness (μ) of Photoresist Layer | Thickness (μ) of Polyamide Layer | Evaluation of Photoresist Layer coating property | developing speed | formation of pinholes | Evaluation of Polyamide Layer etching speed | adhesion to PET | film strength | side- etching |
|---|---|---|---|---|---|---|---|---|---|
| Example 4 | 2 | 8-9 | good | good | not | good | good | good | small |
| Example 5 | 3-4 | 8-9 | good | good | not | good | good | good | small |
| Comparative Example 3 | below 0.5 | 8-9 | bad | too high | observed | good | good | good | small |
| Comparative Example 4 | 7-8 | 8-9 | good | too low | not | good | good | good | small |

EXAMPLE 6

A light-sensitive composition described below was coated in a thickness of about 3μ on the same polyamide layer as described in Example 3 to form a negative-working type photoresist layer.

| Light-sensitive photoresist composition: | |
|---|---|
| Alkali-soluble phenol-novolak resin | 10 parts by weight |
| 2,6-Di(4'-azidobenzal)-cyclohexanone | 2 parts by weight |
| Ethyl cellosolve acetate/methylethyl ketone/toluene | 100 parts by weight |

| Light-sensitive photoresist composition: -continued | |
|---|---|
| (2/1/1) | |

The so obtained imaging material was imagewise exposed to a 2 KW super-high-pressure mercury lamp at a distance of 1 meter for 2 minutes through a positive film, and was developed with a 0.3% aqueous solution of sodium hydroxide to remove the photoresist layer from the unexposed areas. After the development, the imaging material was rinsed with running water for 30 minutes and dried.

The developed imaging material comprising resist-free areas was lightly rubbed with an absorbent cotton impregnated with the same etching solution as used in Examples 1 to 3, whereby the polyamide layer was removed from the polyester film in the open image areas of the photoresist layer. The obtained image bearing material was excellent and free of defects.

If the thickness of the photoresist layer was changed to the value adopted in Comparative Example 3 or 4, the obtained results were poor as in Comparative Example 3 or 4.

What is claimed is:

1. An imaging, light-sensitive material, comprising: a transparent substrate; an etchable, polyamide layer overlying said substrate, said polyamide layer having a thickness of from 2 to 11 microns and containing a dye or pigment so that said layer is opaque to actinic light, the film-forming component of said polyamide layer comprising alcohol-soluble polyamide as the major film-forming ingredient, said alcohol-soluble polyamide ingredient being one or a mixture of materials selected from the group consisting of nylon 6/66, nylon 6/66/610, nylon 6/66/610/612, nylon 6/66/12 and N-alkoxyalkyl polyamides wherein the alkoxy and alkyl groups each have from 1 to 8 carbon atoms and the degree of alkoxyalkylation is from 10 to 40%; a light-sensitive photoresist layer overlying said polyamide layer, said light-sensitive photoresist layer having a thickness of from 0.5 to 5 microns and containing a light-sensitive agent selected from the group consisting of azide compounds, o-quinone diazide compounds and organic solvent-soluble diazo compounds, said light-sensitive photoresist layer being capable of being transformed by imagewise exposure to actinic radiation into exposed and non-exposed areas which have different solubilities in an alkaline developer so that the areas which are more soluble in the alkaline developer can be removed to form a developed relief image whereupon the uncovered areas of said polyamide layer can be removed by an etching solution.

2. An imaging material as set forth in claim 1 wherein the thickness of said polyamide layer is in the range of from 4 to 10 microns.

3. An imaging material as set forth in claim 1 wherein said polyamide layer further comprises an oil-soluble dye.

4. An imaging material as set forth in claim 1 wherein said transparent substrate is a sheet or film of a polymer selected from the group consisting of polyethylene terephthalate, polypropylene, polystyrene, polycarbonate and cellulose acetate.

5. An imaging material as set forth in claim 1 or claim 2 in which the film-forming component of said polyamide layer consists essentially of a mixture of from 50 to 90% by weight of said N-alkoxyalkyl polyamide and the balance is nylon copolymer selected from the group consisting of nylon 6/66, nylon 6/66/610, nylon 6/66/610/612 and nylon 6/66/12.

6. An imaging material as set forth in claim 1 or claim 2 in which the film-forming component of said polyamide layer consists essentially of a mixture of from 80 to 99.9% by weight of said N-alkoxyalkyl polyamide and the balance is selected from the group consisting of cellulose nitrate, cellulose acetate propionate, cellulose acetate butyrate and cellulose propionate.

7. An imaging material as set forth in claim 1 or claim 2 in which said light-sensitive photoresist layer contains an alkali-soluble resin selected from the group consisting of alkali-soluble phenol-formaldehyde resins and alkali-soluble styrene-maleic anhydride resins.

* * * * *